US010756279B2

(12) United States Patent
Odaka et al.

(10) Patent No.: US 10,756,279 B2
(45) Date of Patent: Aug. 25, 2020

(54) DISPLAY MODULE

(71) Applicant: Japan Display Inc., Minato-ku (JP)

(72) Inventors: Kazuhiro Odaka, Minato-ku (JP);
Toshihiro Sato, Minato-ku (JP);
Masamitsu Furuie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/263,595

(22) Filed: Jan. 31, 2019

(65) Prior Publication Data

US 2019/0165288 A1 May 30, 2019

Related U.S. Application Data

(63) Continuation of application No. 15/384,835, filed on Dec. 20, 2016, now Pat. No. 10,263,200.

(30) Foreign Application Priority Data

Dec. 24, 2015 (JP) ................. 2015-251246

(51) Int. Cl.
*H01L 51/00* (2006.01)
*H01L 27/32* (2006.01)
(52) U.S. Cl.
CPC ...... *H01L 51/0097* (2013.01); *H01L 27/3276* (2013.01); *Y02E 10/549* (2013.01)
(58) Field of Classification Search
None
See application file for complete search history.

(56) References Cited

U.S. PATENT DOCUMENTS

| 9,543,533 | B2 | 1/2017 | Yamazaki |
| 2011/0007042 | A1 | 1/2011 | Miyaguchi |
| 2012/0146886 | A1 | 6/2012 | Minami et al. |
| 2014/0002385 | A1* | 1/2014 | Ka ............... G06F 1/1601 345/173 |

(Continued)

FOREIGN PATENT DOCUMENTS

| CN | 102855822 A | 1/2013 |
| JP | 2012-128006 | 7/2012 |

(Continued)

OTHER PUBLICATIONS

Office Action dated Jan. 30, 2018 in Korean Patent Application No. 10-2016-0176794, with English translation, 3 pages.

(Continued)

*Primary Examiner* — Lex H Malsawma
(74) *Attorney, Agent, or Firm* — Oblon, McClelland, Maier & Neustadt, L.L.P.

(57) ABSTRACT

A display module includes an insulating substrate and a plurality of pixels each located on the insulating substrate and including a light-emitting element layer. The insulating substrate includes a display area where the plurality of pixels are disposed, a picture-frame area outside the display area, an outer area that is in contact with an opposite side of the picture-frame area from the display area, and a plurality of terminals located on the outer area and arranged in a direction. The outer area includes a narrowed portion whose length in the direction is shorter than a length of the display area in the direction.

8 Claims, 8 Drawing Sheets

(56) References Cited

U.S. PATENT DOCUMENTS

2014/0254111 A1* 9/2014 Yamazaki ........... H01L 51/0097
   361/749
2014/0367661 A1  12/2014 Akagawa
2015/0255740 A1   9/2015 Nakada

FOREIGN PATENT DOCUMENTS

| JP | 2013-15836 A | 1/2013 |
| JP | 2014-197181 A | 10/2014 |
| KR | 10-2013-0004085 A | 1/2013 |
| KR | 10-2015-0126353 | 11/2015 |

OTHER PUBLICATIONS

Office Action dated Sep. 7, 2018, in Korean Patent Application No. 10-2016-0176794 w/Computer Generated English-language Translation.

Office Action dated Mar. 5, 2019 in Japanese Patent Application No. 2015-251246, 5 pages (with unedited computer generated English translation).

Combined Chinese Office Action and Search Report dated Dec. 24, 2019, in Patent Application No. 201611201230.X, 16 pages (with unedited computer generated English translation and English Translation of Category of Cited Documents).

* cited by examiner

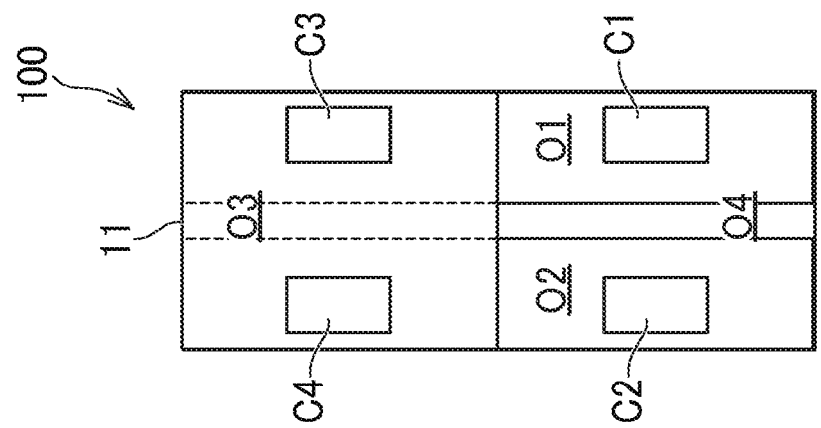
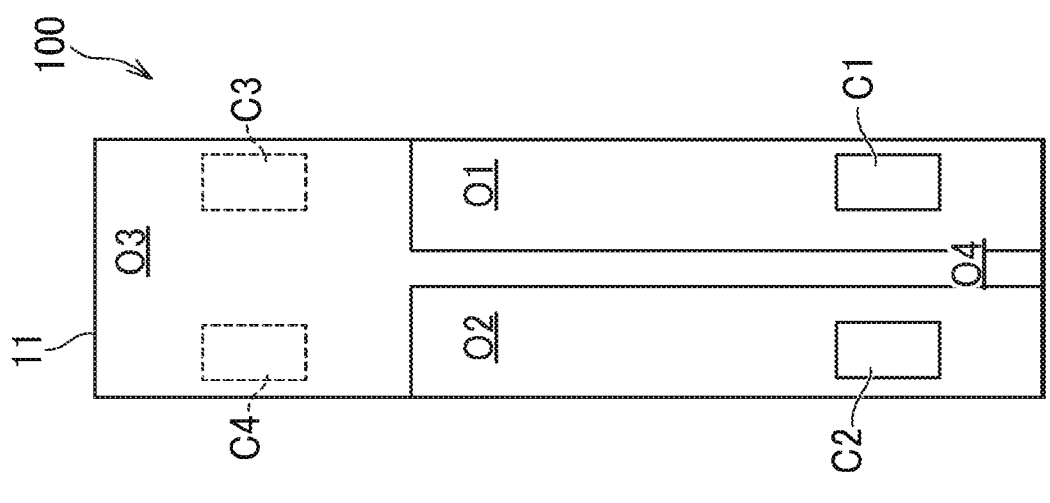
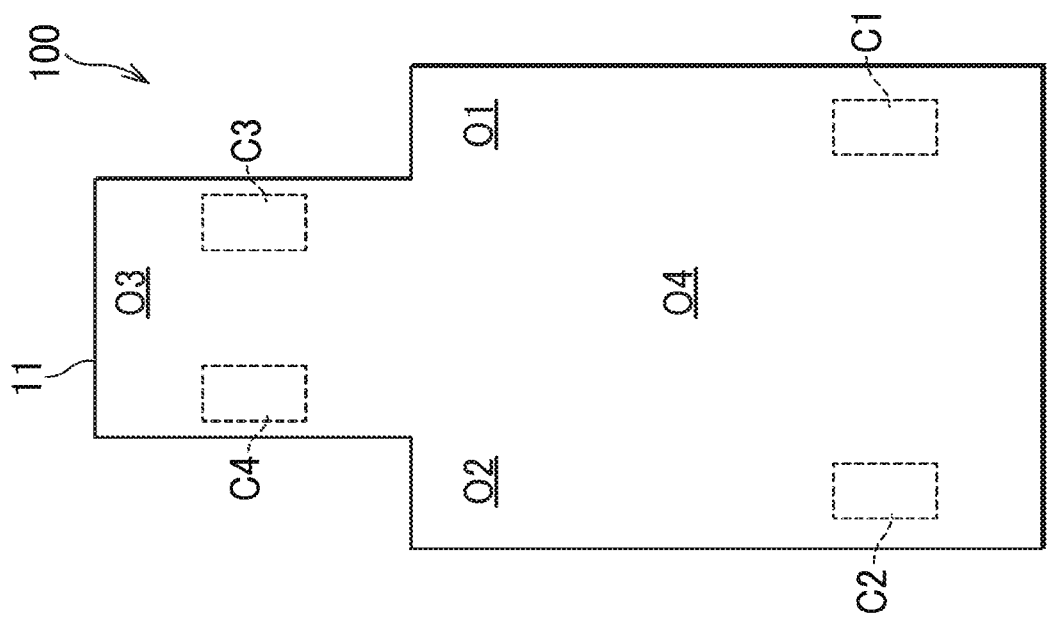

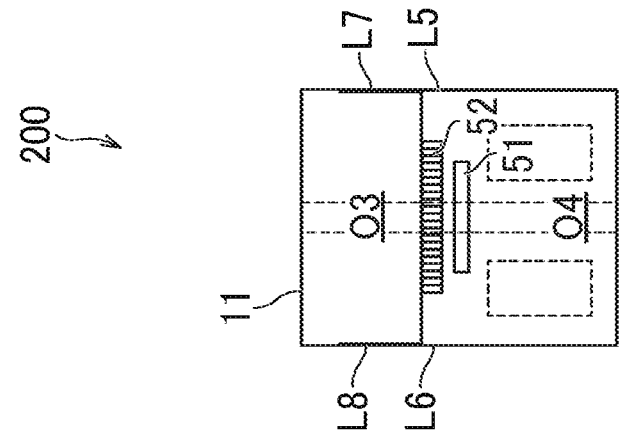
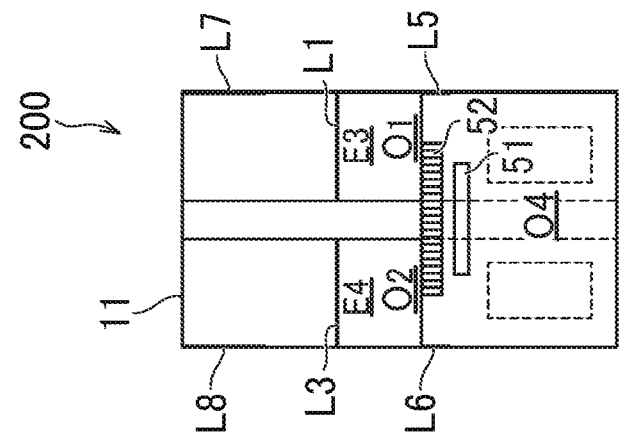
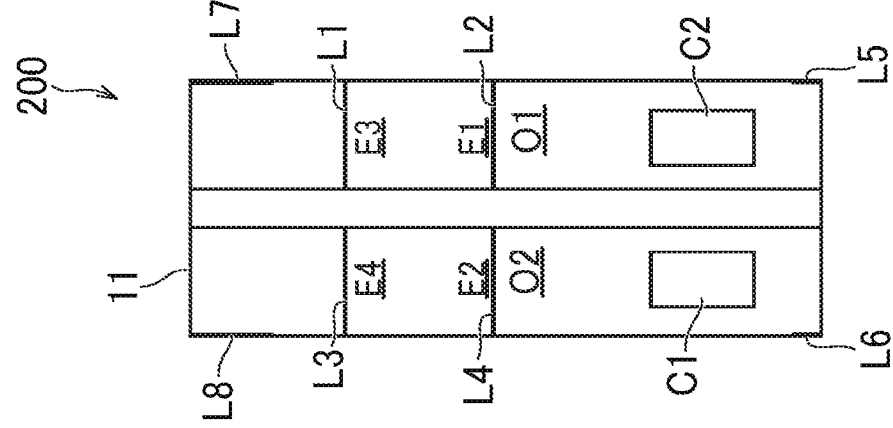
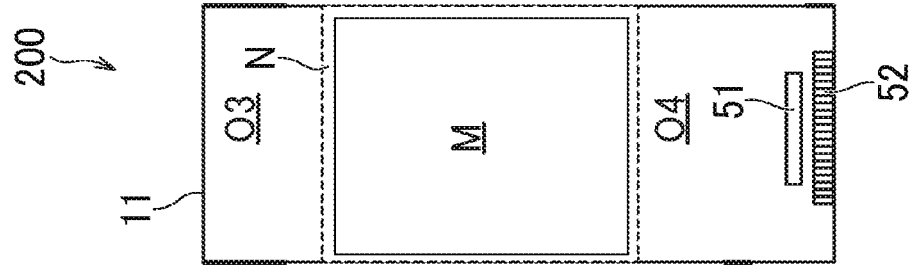

DISPLAY MODULE

CROSS-REFERENCE TO RELATED APPLICATION

The present application is a continuation of U.S. application Ser. No. 15/384,835 filed Dec. 20, 2016, and claims priority from Japanese application JP2015-251246 filed on Dec. 24, 2015, the content of each of which is hereby incorporated by reference into this application.

BACKGROUND OF THE INVENTION

1. Field of the Invention

The present invention relates to a display module.

2. Description of the Related Art

A bendable substrate has been conventionally known as a substrate constituting a display device including a display area where an image is displayed, and a picture-frame area outside the display area. JP 2012-128006 A discloses a technique for achieving a narrower picture-frame by bending the four sides of the substrate.

A contact portion for supplying power from an external power supply to the display area via a flexible wiring board or the like may be provided in the picture-frame area of the display device. It is preferable for the contact portion to have a larger area in view of a lower resistance. However, increasing the area of the contact portion gives rise to the need for widening the picture-frame area along with the increase.

SUMMARY OF THE INVENTION

It is an object of the invention to provide a display module capable of achieving a lower resistance of a contact portion and realizing a narrower picture-frame.

A display module according to an aspect of the invention includes: an insulating substrate; and a plurality of pixels each located on the insulating substrate and including a light-emitting element layer, wherein the insulating substrate includes a display area where the plurality of pixels are disposed, a picture-frame area outside the display area, an outer area that is in contact with an opposite side of the picture-frame area from the display area, and a plurality of terminals located on the outer area and arranged in a direction, and the outer area includes a narrowed portion whose length in the direction is shorter than the length of the display area in the direction.

A display module according to another aspect of the invention includes an insulating substrate including a display area where a plurality of pixels are disposed, a first substrate-edge that extends in a direction extending along a first side of the display area, a second substrate-edge that extends in a direction extending along a second side of the display area and intersects the first substrate-edge, the second side intersecting the first edge, and an outer area that intersects the first substrate-edge and protrudes to a side opposite to the display area, wherein the first substrate-edge includes a first portion that is in contact with the second substrate-edge and a second portion that is in contact with the outer area, the first portion is spaced apart from the second portion, and the outer area is bendable.

BRIEF DESCRIPTION OF THE DRAWINGS

FIG. 4A is a diagram illustrating a folding step of the polyimide film in the first embodiment.

FIG. 4B is a diagram illustrating the folding step of the polyimide film in the first embodiment.

FIG. 4C is a diagram illustrating the folding step of the polyimide film in the first embodiment.

FIG. 7A is a diagram illustrating a folding step of the polyimide film in the second embodiment.

FIG. 7B is a diagram illustrating the folding step of the polyimide film in the second embodiment.

FIG. 7C is a diagram illustrating the folding step of the polyimide film in the second embodiment.

FIG. 7D is a diagram illustrating the folding step of the polyimide film in the second embodiment.

DETAILED DESCRIPTION OF THE INVENTION

Hereinafter, first to third embodiments of the invention will be described with reference to the drawings.

Figure 1:
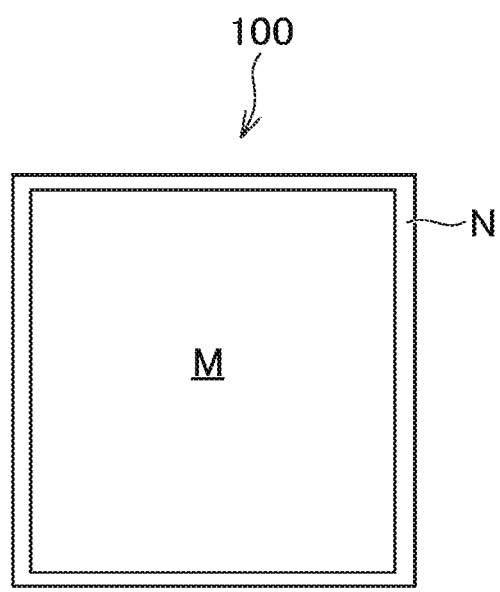
FIG. 1 is a plan view showing a display device according to a first embodiment.
Figure 2:
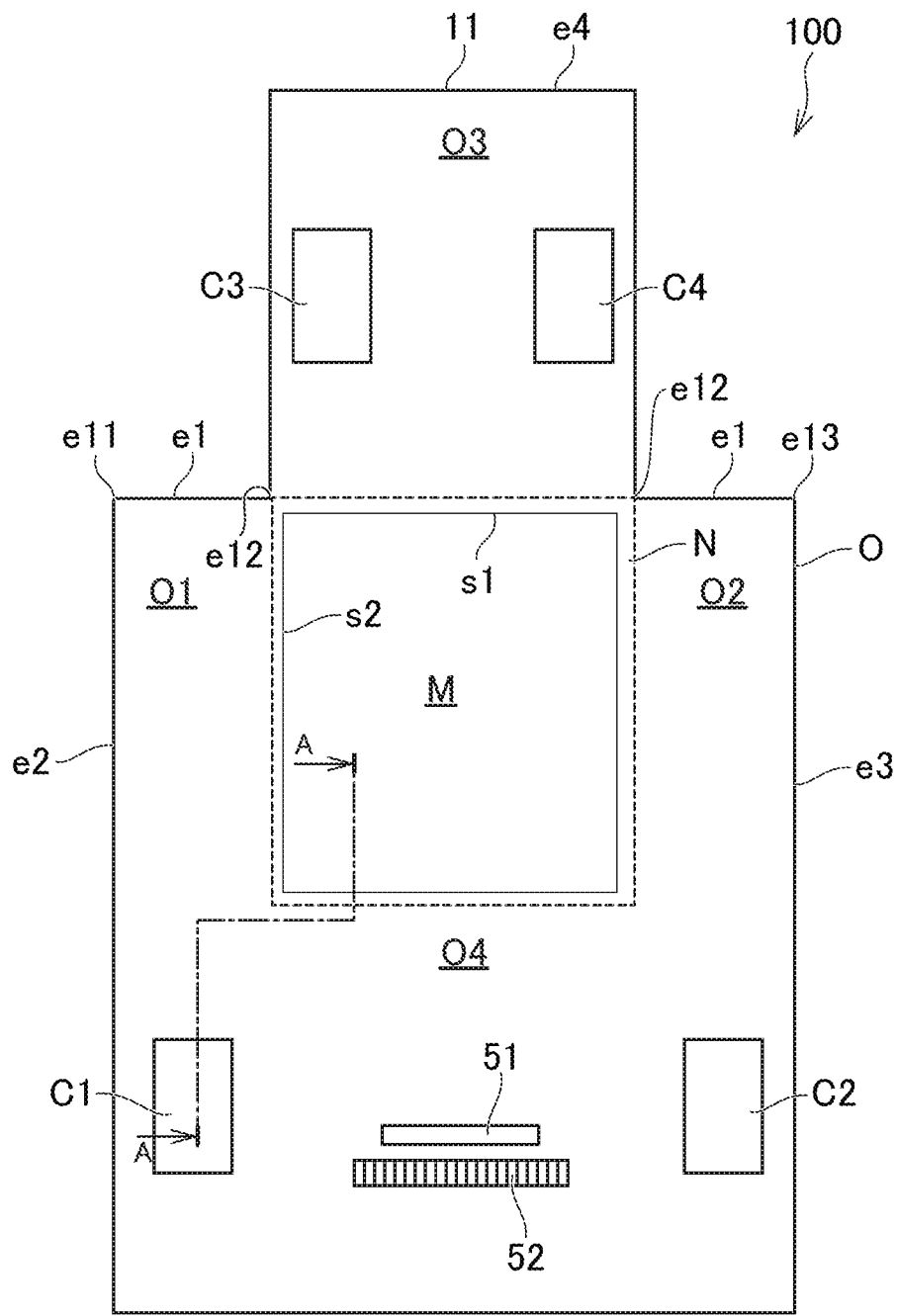
FIG. 2 is a developed plan view showing a developed state of a polyimide film of the display device according to the first embodiment.
Figure 3:
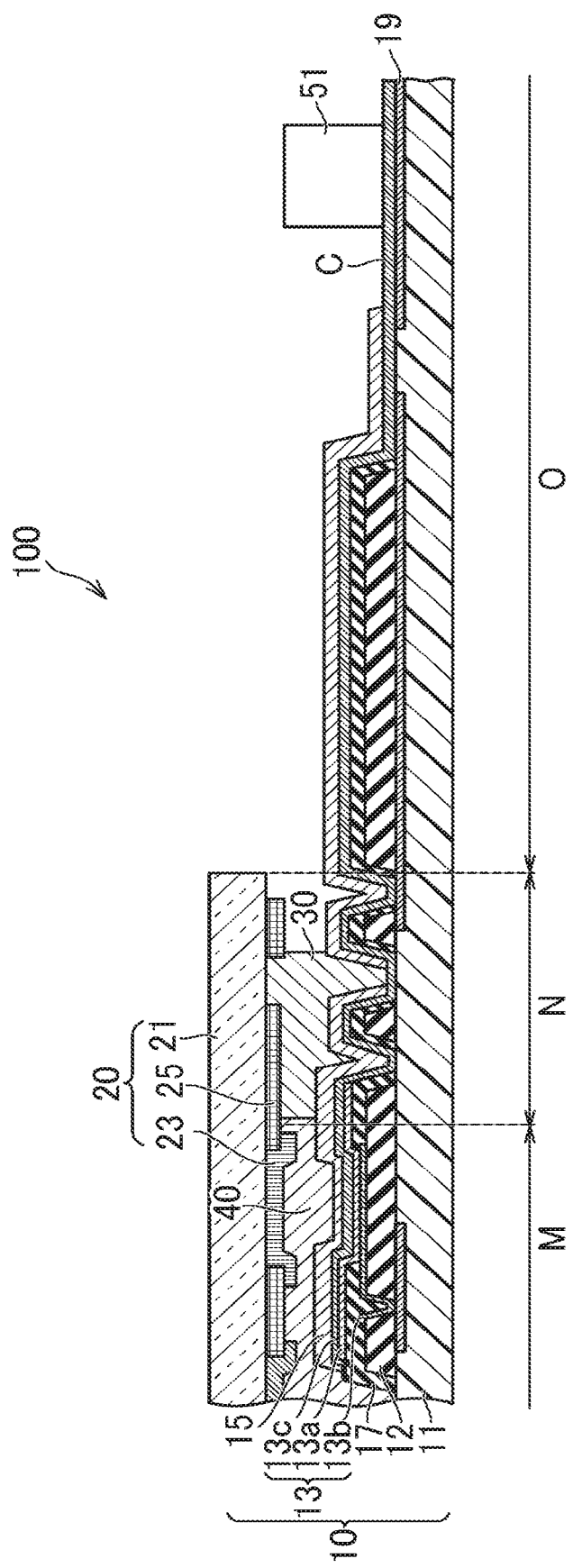
FIG. 3 is a schematic cross-sectional view schematically showing the display device according to the first embodiment, taken along the line A-A in FIG. 2.
Figure 5A:
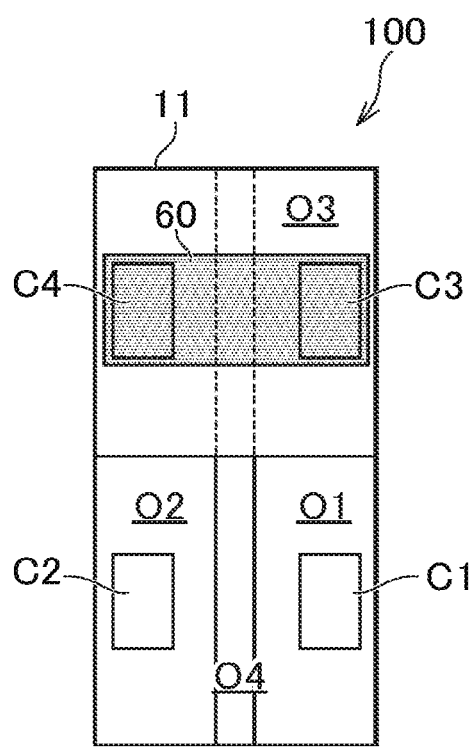
FIG. 5A is a diagram illustrating the folding step of the polyimide film in the first embodiment.
Figure 5B:
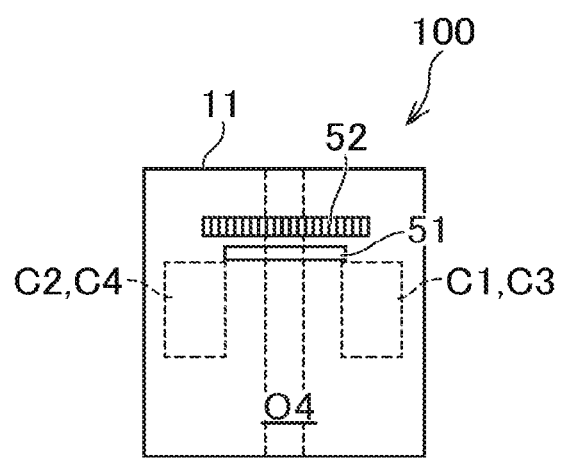
FIG. 5B is a diagram illustrating the folding step of the polyimide film in the first embodiment.

First, with reference to FIGS. 1 to 3, a display device according to the first embodiment will be described. FIG. 1 is a plan view showing the display device according to the first embodiment. FIG. 2 is a developed plan view showing a developed state of a polyimide film of the display device according to the first embodiment. FIG. 3 is a schematic cross-sectional view schematically showing the display device according to the first embodiment, taken along the line A-A in FIG. 2.

As shown in FIG. 1, the display device 100 includes a display area M where an image is displayed, and a picture-frame area N outside the display area M. A plurality of unit pixels are disposed in a matrix in the display area M.

The display device 100 has flexibility and has a structure in which a plurality of layers are stacked on a polyimide film 11 as a bendable insulating substrate. As shown in FIG. 2, the polyimide film 11 is configured to include an outer area O further outside the picture-frame area N in a developed state.

In the first embodiment, the outer area O is configured to include outer areas O1 and O2 respectively provided to the left and right of the display area M, an outer area O3 provided to the top of the display area M, and an outer area O4 provided to the bottom of the display area M. In the outer area O4, a driver integrated circuit (IC) 51 and terminals 52 to which a flexible wiring board (flexible printed circuits (FPC); not shown) and the like are electrically connected are mounted. Here, as shown in FIG. 2, a side of the display area M that extends in one direction is defined as a first side s1, and a side that extends in a direction intersecting the first side s1 is defined as a second side s2. An edge of the outer area O1 that extends in a direction extending along the first side s1 is defined as a first substrate-edge e1, and an edge that extends in a direction extending along the second side s2 and intersects the first substrate-edge e1 is defined as a second substrate-edge e2. An edge of the outer area O2 that extends in the direction extending along the first side s1 is defined as a first substrate-edge e1, and an edge that extends in the direction extending along the second side s2 and is opposite the second substrate-edge e2 is defined as a third substrate-edge e3. A portion where the first substrate-edge e1 and the second substrate-edge e2 are in contact with each other is defined as a first portion e11. A portion where the first substrate-edge e1 and the outer area O3 are in contact with each other is defined as a second portion e12. A portion where the first substrate-edge e1 and the third substrate-edge e3 are in contact with each other is defined as a third portion e13. As shown in FIG. 2, the first portion e11 and the second portion e12 are spaced apart from each other, and the second portion e12 and the third portion e13 are spaced apart from each other.

As shown in FIG. 3, the display device 100 includes a thin film transistor (TFT) substrate 10 including thin film transistors, and a counter substrate 20 provided to face the TFT substrate 10. The counter substrate 20 is attached to the TFT substrate 10 via a sealing member 30 formed along the edge of the TFT substrate 10 and a filling material 40 filled in an area surrounded by the sealing member 30.

The TFT substrate 10 includes the polyimide film 11 described above, an insulating film 12, a self-emitting element layer 13, and a sealing film 15 that seals the self-emitting element layer 13.

The self-emitting element layer 13 is a layer that emits light with a luminance controlled for each of a plurality of unit pixels constituting a pixel. The self-emitting element layer 13 is provided in at least the display area M, and includes an organic electro-luminescence (EL) layer 13a, an anode electrode 13b as a lower electrode provided below the organic EL layer 13a, and a cathode electrode 13c as an upper electrode provided on the organic EL layer. In the first embodiment, the upper electrode is a cathode electrode while the lower electrode is an anode electrode. However, this is not restrictive; the upper electrode may be an anode electrode while the lower electrode may be a cathode electrode.

An area of the organic EL layer 13a that covers the anode electrode 13b serves as a light-emitting area, and an area that is spaced apart from the cathode electrode 13c by a bank layer 17 serves as a non-light-emitting area. The organic EL layer 13a is configured by successively stacking and disposing, from the cathode side toward the anode side, an electron transport layer, a light-emitting layer, and a hole transport layer. When a DC voltage is applied to the anode electrode 13b and the cathode electrode 13c, holes injected from the cathode electrode 13c pass through the hole transport layer while electrons injected from the anode electrode 13b pass through the electron transport layer. The electrons and holes reach the organic EL layer 13a and are recombined together. By the recombination of the electrons and holes, the organic EL layer 13a emits light at a predetermined wavelength.

In the display device 100 as shown in FIG. 3, the cathode electrode 13c is formed to extend to the outer area O of the polyimide film 11. The cathode electrode 13c is covered by the sealing film 15, but includes a contact portion C (C1 to C4) that is not covered by the sealing film 15 and thus exposed therefrom in the outer area O4. The contact portion C is electrically connected to a feeding unit that is externally provided, and plays the role of supplying power to the display area M.

As shown in FIG. 2, the first embodiment employs a configuration in which the contact portion C1 is provided in the outer area O1 of the polyimide film 11, the contact portion C2 is provided in the outer area O2, and the contact portions C3 and C4 are provided in the outer area O3. In the first embodiment, feeding to the display area M is performed via the contact portions C1 and C2 provided in the outer areas O1 and O2.

On the other hand, as shown in FIG. 3, the counter substrate 20 includes a glass substrate 21, color filters 23 provided below the glass substrate 21, and a black matrix 25 provided around the color filters 23. In the first embodiment, the configuration in which the glass substrate 21 is used is described. However, this is not restrictive, and a film or the like having flexibility may be used.

The color filters 23 are separately provided for each of the unit pixels disposed in the display area M. The color filter 23 absorbs light at a specific wavelength and transmits light at other wavelengths. As the color filters 23, color filters that are colored red R, green G, and blue B, for example, may be used. The black matrix 25 is formed in a matrix so as to surround the color filters 23 of the respective colors, and blocks light from the self-emitting element layer 13.

Next, with reference to FIGS. 4A to 4C and FIGS. 5A and 5B, the folding of the polyimide film 11 will be described. In the first embodiment, a narrower picture-frame is achieved by employing a configuration in which the outer area O is folded onto the back side of the TFT substrate 10. FIGS. 4A to 4C and FIGS. 5A and 5B are diagrams of the display device according to the first embodiment as viewed from the back side thereof, illustrating a folding step of the polyimide film. FIG. 4A is a diagram of the display device 100 with the polyimide film developed, as viewed from the back side of the display device 100. That is, FIG. 4A is a diagram of the display device 100 shown in FIG. 2, as viewed from the back side thereof. The broken lines in FIGS. 4A to 4C and FIGS. 5A and 5B represent the contact portions viewed in perspective.

First, the outer area O1 and the outer area O2 are folded onto the back side of the TFT substrate 10, thereby being brought into the state shown in FIG. 4B. In the state of FIG. 4B, the contact portions C1 and C2 are in the state of facing the side of the display area M, the surface being an opposite side of a display surface. Further, the outer area O3 is folded onto the back side of the TFT substrate 10 to be brought into the state shown in FIG. 4C. In the state shown in FIG. 4C, the contact portions C3 and C4 are in the state of facing the side of the display area M, the surface being an opposite side of a display surface.

Next, the contact portion C3 and the contact portion C4, which are provided in the outer area O3 and next to each other, are electrically connected using a conductive tape. As the conductive tape, a double-faced tape may be used. The conductive tape is used in the first embodiment, but this is not restrictive. Any material may be used as long as the material can be conductive and is bondable. For example, a conductive adhesive may be used.

Further, the outer area O4 is folded onto the back side of the TFT substrate 10 such that the contact portion C2 and the contact portion C4 overlap each other, and that the contact portion C1 and the contact portion C3 overlap each other. The outer area O4 folded is attached to the outer area O3 with a conductive tape 60 (see FIG. 5A) as a double-faced tape. Since the outer area O3 and the outer area O4 are secured together with the double-faced tape, the folded state of the outer areas O1 to O4 is retained (see FIG. 5B).

Moreover, the contact portions C1 to C4 are electrically connected to each other with the conductive tape 60 having a low resistance, and are in the state of having substantially the same potential (common potential). Therefore, compared with the case where the contact portions are electrically connected via metal or the like, a lower resistance can be achieved. As a result, a luminance gradient caused by a voltage drop can be prevented.

As has been described above, since a configuration in which the contact portions C1 to C4 of the cathode electrode 13c are disposed outside the picture-frame area N (in an area other than an area facing the counter substrate 20) is employed in the first embodiment, a narrower picture-frame can be achieved compared with a configuration in which the contact portions C1 to C4 are disposed in the picture-frame area N. Moreover, since the areas of the contact portions C1 to C4 of the cathode electrode 13c can be made large irrespective of the width of the picture-frame area N, a lower resistance can be achieved.

The shape of the outer area O is not limited to that shown in the drawings. For example, the outer area O may have a shape in which areas of the outer areas O1 and O2 other than the portions where the contact portions C1 and C2 are disposed are removed. Moreover, a slit or notch may be appropriately formed so that the polyimide film 11 is easily bent.

Moreover, an aluminum wiring 19 may be provided as a signal wiring layer, as shown in FIG. 3, in order that the cathode electrodes may be conductive to each other. The cathode electrodes are conductive to each other through the aluminum wiring 19 having a thickness, so that a lower resistance can be achieved. The aluminum wiring 19 may be covered with an indium tin oxide (ITO) layer for preventing the corrosion or the like of aluminum.

Figure 6:
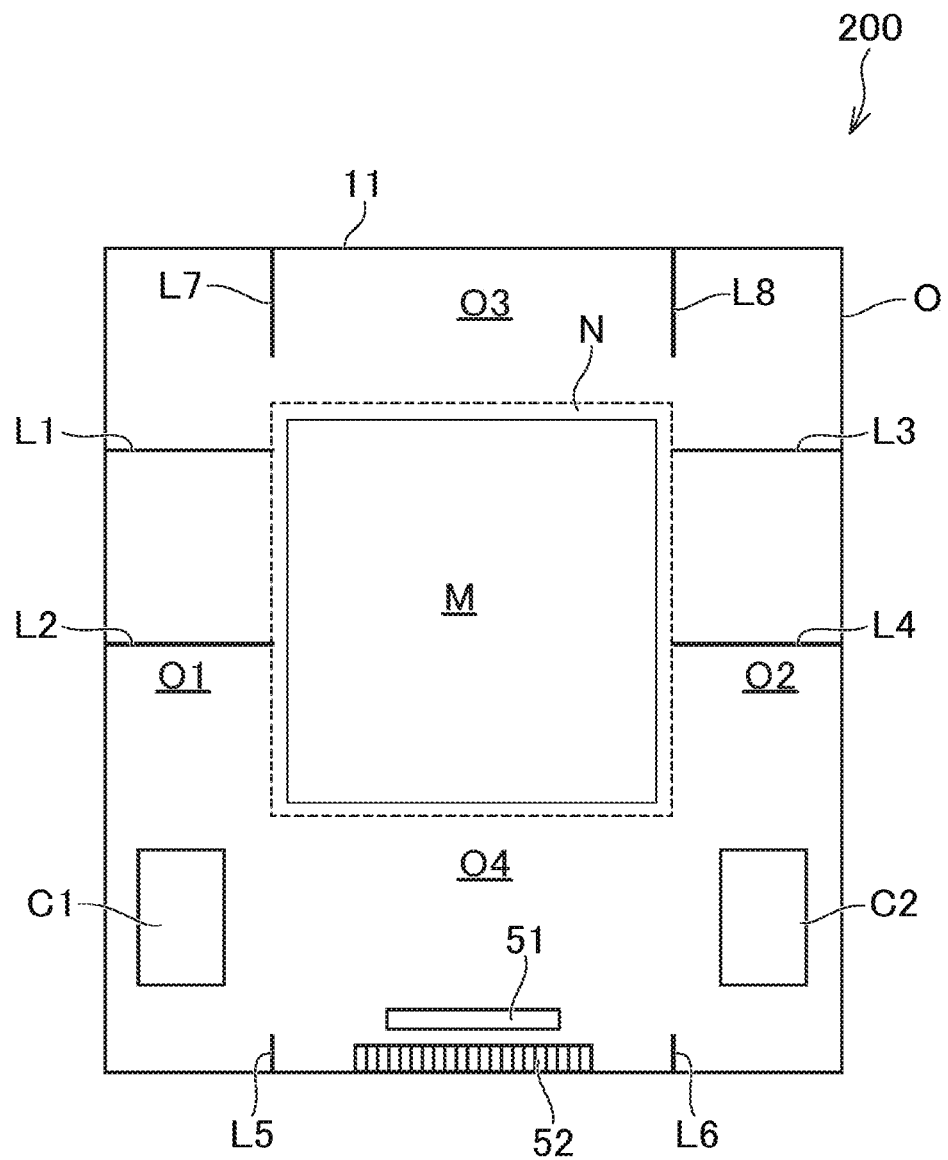
FIG. 6 is a developed plan view showing a developed state of a polyimide film of a display device according to a second embodiment.

Next, with reference to FIG. 6 and FIGS. 7A to 7D, a display device 200 according to the second embodiment will be described. FIG. 6 is a developed plan view showing a developed state of a polyimide film of the display device according to the second embodiment. FIGS. 7A to 7D are diagrams illustrating a folding step of the polyimide film. In the second embodiment, the same reference numerals and signs are used for configurations similar to those of the first embodiment, and the description of the similar configurations is omitted. The broken lines in FIGS. 7C and 7D represent contact portions viewed in perspective.

As shown in FIG. 6, the display device 200 includes the display area M and the picture-frame area N outside the display area M, similarly to the display device 100 according to the first embodiment. The polyimide film 11 of the second embodiment includes the outer area O further outside the picture-frame area N. The outer area O includes the outer areas O1 and O2 respectively provided to the left and right of the display area M, the outer area O3 provided to the top of the display area M, and the outer area O4 provided to the bottom of the display area M.

Cuts L1 and L2 are provided in the outer area O1 of the polyimide film 11, and cuts L3 and L4 are provided in the outer area O2. A cut L5 is provided at the boundary between the outer area O1 and the outer area O4, and a cut L6 is provided at the boundary between the outer area O2 and the outer area O4. A cut L7 is provided at the boundary between the outer area O1 and the outer area O3, and a cut L8 is provided at the boundary between the outer area O2 and the outer area O3.

With reference to FIGS. 7A to 7D, the folding of the polyimide film 11 of the second embodiment will be described.

First, the outer area O1 and the outer area O2 are folded onto the back side of the TFT substrate 10. FIG. 7A shows the state. FIG. 7B is a diagram of the display device 200 shown in FIG. 7A, as viewed from the back side thereof. Similarly, FIGS. 7C and 7D are diagrams of the display device as viewed from the back side thereof.

Next, as shown in FIG. 7C, the outer area O4 is folded onto the back side of the TFT substrate 10. On this occasion, a cut edge E1 of the outer area O1 that is formed by the cut L2 is interposed between portions of the outer area O1 and the outer area O4 that are separated by the cut L5. Similarly, a cut edge E2 of the outer area O2 that is formed by the cut L4 is interposed between portions of the outer area O2 and the outer area O4 that are separated by the cut L6. With this configuration, the folded state of the outer area O4 is retained.

Further, as shown in FIG. 7D, the outer area O3 is folded onto the back side of the TFT substrate 10. On this occasion, a cut edge E3 of the outer area O1 that is formed by the cut L1 is interposed between portions of the outer area O1 and the outer area O3 that are separated by the cut L7. Similarly, a cut edge E4 of the outer area O2 that is formed by the cut L3 is interposed between portions of the outer area O2 and the outer area O3 that are separated by the cut L8. With this configuration, the folded state of the outer area O3 is retained.

As has been described above, in the configuration of the second embodiment, the state of the outer area O folded onto the back side of the TFT substrate 10 is retained without using a double-faced tape, an adhesive, or the like. Also in the second embodiment, a conductive tape or the like may be attached so that the contact portion C1 and the contact portion C2 are electrically connected in the folded state of the outer area O. However, the second embodiment has a configuration in which the folded state of the outer area O is retained by forming a plurality of cuts in the polyimide film 11 as described above. Therefore, a double-faced tape does not need to be used as a conductive tape.

The cuts in the polyimide film 11 are not limited to those shown in the second embodiment, but any cuts may be used as long as the cuts are formed so as to retain the folded state of the folded polyimide film 11 without using a tape or the like. The number, size, and position of cuts may be appropriately selected.

Figure 8:
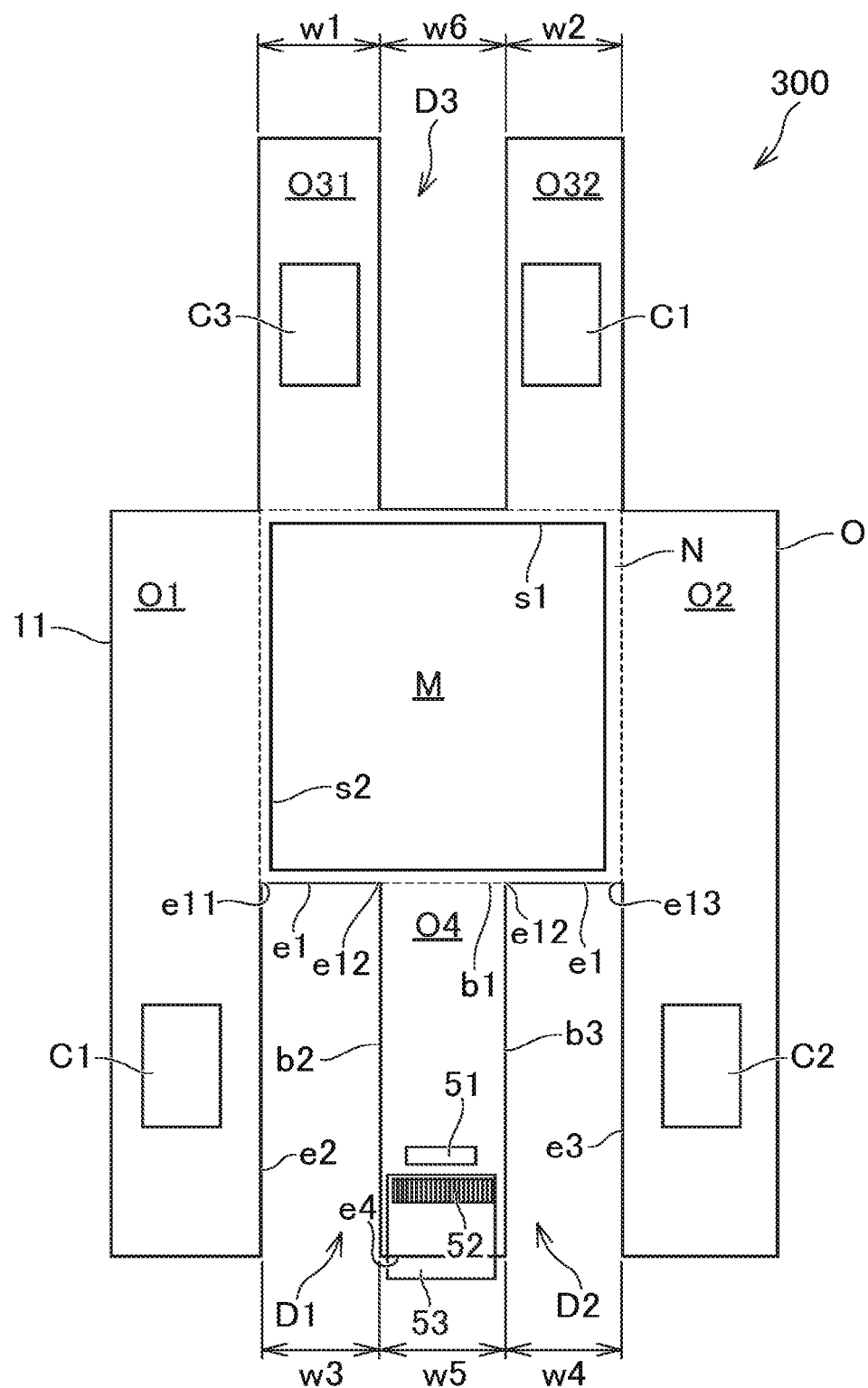
FIG. 8 is a developed plan view showing a developed state of a polyimide film of a display device according to a third embodiment.

Next, with reference to FIG. 8, a display device 300 according to the third embodiment will be described. FIG. 8 is a developed plan view showing a developed state of a polyimide film of the display device according to the third embodiment. In the third embodiment, configurations other than the shape of the polyimide film 11 are similar to those described in the first embodiment. Moreover, in the third embodiment, the way to fold the polyimide film 11 and the connection method of the contact portion C are the same as those described in the first embodiment, and therefore, the description thereof is omitted. Here, as shown in FIG. 8, a side of the display area M that extends in one direction is defined as a first side s1, and a side that extends in a direction intersecting the first side s1 is defined as a second side s2. As shown in FIG. 8, an edge of the insulating substrate 10 that extends in a direction extending along the first side s1 is defined as a first substrate-edge e1, and an edge that extends in a direction extending along the second side s2 and intersects the first substrate-edge e1 is defined as a second substrate-edge e2. An edge of the insulating substrate 10 that extends in the direction extending along the second side s2 and is opposite the second substrate-edge e2 is defined as a third substrate-edge e3. A portion where the first substrate-edge e1 and the second substrate-edge e2 are in contact with each other is defined as a first portion e11. A portion where the first substrate-edge e1 and the outer area O4 are in contact with each other is defined as a second portion e12. A portion where the first substrate-edge e1 and the third substrate-edge e3 are in contact with each other is defined as a third portion e13. As shown in FIG. 8, the first portion e11 and the second portion e12 are spaced apart from each other, and the second portion e12 and the third portion e13 are spaced apart from each other.

As shown in FIG. 8, the display device 300 includes the display area M where an image is displayed, and the picture-frame area N outside the display area M. The polyimide film 11 includes the outer area O further outside the picture-frame area N. The outer area O includes the outer areas O1 and O2 respectively provided to the left and right of the display area M, outer areas O31 and O32 provided to the top of the display area M, and the outer area O4 (narrowed portion) provided to the bottom of the display area M. As shown in FIG. 8, the outer area O4 includes a first side b1 that is in contact with the picture-frame area N, a second side b2 that intersects the first side b1, and a third side b3 that intersects the first side b1 and is opposite the second side b2.

In the polyimide film 11 of the third embodiment, a notch D1 is formed, whereby the outer area O1 and the outer area O4 are configured to be spaced apart from each other. Similarly, a notch D2 is formed, whereby the outer area O2 and the outer area O4 are configured to be spaced apart from each other. Moreover, a notch D3 is formed, whereby the outer area O31 and the outer area O32 are configured to be spaced apart from each other. The contact portion C1 is provided in the outer area O1; the contact portion C2 is provided in the outer area O2; the contact portion C3 is provided in the outer area O31; and the contact portion C4 is provided in the outer area O32. In the outer area O4, the driver IC 51 and the terminals 52 electrically connected to the flexible wiring board 53 or the like are mounted. In FIG. 8, the terminals 52 are shown by the solid lines for convenience of description; actually, however, the terminals 52 are covered and hidden by the flexible wiring board 53 in the state where the flexible wiring board 53 is provided.

In the display device according to the third embodiment, since the area of the polyimide film 11 can be reduced compared with the display device according to the first embodiment, further downsizing and thinning of the device can be achieved in addition to obtaining the advantageous effects described in the first embodiment.

Here, in the polyimide film 11 of the third embodiment, a width w1 of the outer area O31 and a width w3 of the notch D1 are the same as each other as shown in FIG. 8. Similarly, a width w2 of the outer area O32 and a width w4 of the notch D2 are the same as each other. Moreover, a width w5 of the outer area O4 and a width w6 of the notch D3 are the same as each other. However, the polyimide film 11 is not limited to the shape shown in FIG. 8. For example, w5 may be wider than w3 or w4, or a configuration may be employed in which a useless area of the polyimide film 11 is reduced to achieve the thinning of the device.

The polyimide film of each of the first to third embodiments is a configuration corresponding to an insulating substrate of the invention; the TFT substrate is a configuration corresponding to a circuit layer of the invention; the organic EL layer is a configuration corresponding to an organic layer; and the conductive tape is a configuration corresponding to a conductive member. While there have been described what are at present considered to be certain embodiments of the invention, it will be understood that various modifications may be made thereto, and it is intended that the appended claims cover all such modifications as fall within the true spirit and scope of the invention.

What is claimed is:

1. A display module comprising:
  a continuous insulating substrate including a display area where a plurality of pixels are disposed and including a light emitting element;
  a first substrate-edge that extends in a direction extending along a first side of the display area;
  a second substrate-edge that extends in a direction extending along a second side of the display area and intersects the first substrate-edge;
  a first outer area that intersects the first substrate-edge and protrudes to a side opposite to the display area, and
  a second outer area that intersects the second substrate-edge and includes a protruding portion extending parallel to the first outer area, wherein
  the first substrate-edge includes a first portion that is an intersection point of the first substrate-edge and the second substrate-edge and a second portion that is a contact line in contact with the first outer area,
  the first portion is spaced apart from the second portion,
  the first outer area is bendable,
  a picture frame area is formed between an outer edge of the display area and at least a part of the first substrate-edge, and is formed between the outer edge of the display area and at least a part of the second substrate-edge,
  a sealing film is formed on the continuous insulating substrate to cover at least the light emitting element, wherein
  a portion in which a plurality of terminals are juxtaposed is provided in a direction extending along the first side,
  a space is located between the first outer area and the second outer area,
  the sealing film also extends to the picture frame area,
  a first area is formed in a part of a lower layer below the sealing film extending in the direction extending along the second side, and
  the lower layer is exposed by the sealing layer at the first area.

2. The display module according to claim 1, further comprising at least one second area formed in the first area, and the second area is exposed.

3. The display module according to claim 2, wherein
  the lower layer of the sealing film is exposed in the second area and includes a connection area which can be electrically connected to part of another area.

4. The display module according to claim 3, wherein
  a power supply unit that supplies power to the display area is provided outside the display area in the connection area, and
  the lower layer of the sealing film exposed in the second area is electrically connected to the power supply section.

5. The display module according to claim 1, wherein
  a length of a longest portion in the direction extending along the first side of the first outer area is shorter than a length of the first side,
  the plurality of terminals is located on the first outer area and arranged in the direction of the first side.

6. The display module according to claim 1, wherein
a driver IC is disposed on the first outer area and between the second portion and the plurality of terminals, and
the sealing film is formed extending from the display area through the picture-frame area, and is without contact with the driver IC.

7. The display module according to claim 1,
the second outer area is on both sides across the display area, along the direction of the second side, at least one on each side exists on both sides.

8. The display module according to claim 1, wherein
a width of the space is same as a distance between the first portion and the second portion.

* * * * *